United States Patent
Lynch et al.

(10) Patent No.: US 9,177,503 B2
(45) Date of Patent: Nov. 3, 2015

(54) DISPLAY HAVING INTEGRATED THERMAL SENSORS

(75) Inventors: Stephen Brian Lynch, Portola Valley, CA (US); Paul Stephen Drzaic, Morgan Hill, CA (US); Benjamin Mark Rappoport, Los Gatos, CA (US); Fletcher R. Rothkopf, Los Altos, CA (US); John Patrick Ternus, Los Altos, CA (US); Scott Andrew Myers, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 138 days.

(21) Appl. No.: 13/484,887

(22) Filed: May 31, 2012

(65) Prior Publication Data
US 2013/0321361 A1    Dec. 5, 2013

(51) Int. Cl.
*G09G 3/22*     (2006.01)
*G09G 3/32*     (2006.01)
*H01L 27/32*     (2006.01)

(52) U.S. Cl.
CPC .......... *G09G 3/3225* (2013.01); *H01L 27/3225* (2013.01); *G09G 2300/04* (2013.01); *G09G 2300/0819* (2013.01); *G09G 2320/029* (2013.01); *G09G 2320/0233* (2013.01); *G09G 2320/0295* (2013.01); *G09G 2320/041* (2013.01); *G09G 2320/048* (2013.01); *G09G 2330/045* (2013.01)

(58) Field of Classification Search
None
See application file for complete search history.

(56) References Cited

U.S. PATENT DOCUMENTS

| | | | |
|---|---|---|---|
| 7,224,332 B2 | 5/2007 | Cok | |
| 7,456,827 B2 | 11/2008 | Rosmalen | |
| 7,800,879 B2* | 9/2010 | Ryan | 361/103 |
| 8,519,971 B1* | 8/2013 | Mackraz | 345/173 |
| 8,605,069 B2* | 12/2013 | Kasai et al. | 345/211 |
| 2003/0051228 A1* | 3/2003 | Martinez et al. | 717/109 |
| 2005/0030267 A1* | 2/2005 | Tanghe et al. | 345/82 |
| 2005/0280766 A1* | 12/2005 | Johnson et al. | 349/167 |
| 2006/0082274 A1* | 4/2006 | Song | 313/46 |
| 2006/0082523 A1* | 4/2006 | Guo et al. | 345/76 |
| 2007/0215888 A1 | 9/2007 | Mitsuhashi | |
| 2008/0297055 A1 | 12/2008 | Miyake et al. | |
| 2009/0135114 A1* | 5/2009 | White et al. | 345/78 |
| 2010/0182484 A1* | 7/2010 | Iijima et al. | 348/340 |
| 2011/0128311 A1* | 6/2011 | Wakatsuki et al. | 345/691 |
| 2011/0205258 A1 | 8/2011 | Suminoe et al. | |
| 2012/0139955 A1* | 6/2012 | Jaffari et al. | 345/690 |

OTHER PUBLICATIONS

Partial International Search for PCT Application No. PCT/US2013/042499 dated Aug. 1, 2013, 10 pgs.

* cited by examiner

*Primary Examiner* — William Boddie
*Assistant Examiner* — Bipin Gyawali
(74) *Attorney, Agent, or Firm* — Fletcher Yoder PC

(57) ABSTRACT

Thermal sensors are disposed with OLEDs across a display of an electronic device to measure temperatures across the display surface. Thermal sensors may be used to create a temperature map across the display surface due to both the ambient environment and the internal environment of the electronic device. The thermal sensors may be disposed in the OLED layer, on a separate layer, or both. Thermal sensors may be disposed in a substantially 1:1 ratio with OLEDs or with zones of OLEDs. Both the temperature history and usage history for OLEDs may be recorded and processed to determine the age of each OLED. Controllers may adjust the driving strength of OLEDs or adjust the operation of components within the electronic device to compensate for aging or temperature based on the temperature map and age determination. Controllers may move static images from one part of the display to another less-aged part.

26 Claims, 9 Drawing Sheets

DISPLAY HAVING INTEGRATED THERMAL SENSORS

BACKGROUND

The present disclosure relates generally to electronic displays and, more specifically, to displays with integrated thermal sensors.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Electronic devices and systems increasingly include display screens as part of the user interface of the device or system. As may be appreciated, display screens may be employed in a wide array of devices and systems, including desktop computer systems, notebook computers, and handheld computing devices, as well as various consumer products, such as cellular phones, televisions, and portable media players.

To display images, videos, and user interfaces, displays use arrays of pixels, each pixel having multiple colors. Primary colors of light (e.g., red, green, and blue) may be combined in each pixel to create many other colors, including white. Controllers drive pixels with coordinated instructions to create an image on the display. Some displays involve illuminating a backlight through a light-modulating liquid crystal layer (e.g., typical liquid crystal displays) while others involve directly illuminating each pixel to a desired intensity (e.g., organic light emitting diode (OLED) displays).

Because each OLED may emit its own colored light, OLED displays may be thinner and lighter than displays requiring a backlight. OLEDs may also be desirable because they may be fabricated on flexible or rigid substrates. OLED displays may also allow better viewing angles and better color than some liquid crystal displays (LCDs).

However, the appearance of OLED displays may not remain constant indefinitely. As OLED displays age through use, their brightness and/or color may change. Some OLEDs, particularly blue OLEDs, age more quickly than others, which may change the appearance of the display. Furthermore, aging may be accelerated by heat.

While OLED displays do not require a backlight, a variety of other electrical components may be placed in various locations beneath a display. These components facilitate the operation and function of the electronic device. Some components of an electronic device that may be beneath an OLED display include processors, radio transmitters, batteries, speakers, cameras etc. Some of these components draw current and may warm during use. Some components, such as a processor or radio transmitter, may get particularly warm during use or extended use. As a result, portions of the display may also warm due to these warming components beneath the display. Moreover, because some components may warm more than other components, some portions of the display may warm more than other portions.

Heat may affect characteristics of emitted light from OLEDs. In addition to accelerating aging, the color and brightness of light emitted by OLEDs may be affected by the operating temperature. The brightness of some OLEDs, particularly red OLEDs, may decrease as operating temperatures increase. Over time as each OLED ages due to use and temperature, images shown on parts of the display may appear different from the intended image. Controllers may make changes to compensate for such shifts in brightness and color. However, color and brightness shifts may occur differently across a display due to unpredictable use of each OLED and the components beneath each OLED.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Aging may occur in an unpredictable manner due to differential use of the display and components by end users. Knowing the operating temperature, temperature history, and/or usage history of the OLEDs could improve compensation. Accordingly, embodiments of the present disclosure relate to OLED displays and techniques to adjust OLED displays to maintain a desired appearance. Thermal sensors may be integrated in the OLED display and may be used to determine a present temperature, a temperature history, and/or a thermal profile of individual OLEDs or zones of OLEDs so that the control signals to the OLED or zones of OLEDs may be adjusted to compensate for temperature and/or thermal aging. Thermal sensors integrated in the display may also be used to determine thermal characteristics of components beneath the display to adjust the operation of the components. In an embodiment, each OLED is associated with a thermal sensor to measure the temperature and/or aging characteristics of that particular OLED. The integrated thermal sensors may enable controllers to maintain a substantially uniform display appearance throughout the life of the display regardless of use and temperature variations.

OLEDs at high operating temperatures may emit light different from OLEDs at low operating temperatures, which may result in a poor display quality for displays with non-uniform temperature gradients. Non-uniform temperatures may exist across a display due to the ambient environment, power consumed by components of the OLED display, or heat emitted by components beneath the OLED display (e.g., processor, radio transmitter). In some embodiments, integrated thermal sensors measure the temperature of the OLEDs across the display to create a temperature map. The temperature map may indicate OLEDs with present operating temperatures beyond known thresholds such that the emitted light does not match the target emitted light and/or the temperature map may relate to historical average temperatures of the OLEDs, where average higher temperatures may indicate which OLEDs are aging faster with respect to other OLEDs. In some embodiments, controllers may adjust the driving strength of the OLEDs to compensate for shifts in brightness and/or color based at least in part on the temperature map of the display. In other embodiments, controllers may move the image to be displayed from one portion of the display to another portion based at least in part on the temperature map of the display. In still other embodiments, the operation of some components beneath the OLED display may be adjusted or slowed based at least in part on the temperature map of the display.

As mentioned above, aged OLEDs may emit light different from less aged OLEDs, and operating temperature affects aging. As OLEDs age at different rates and are subject to prolonged increased operating temperatures, the overall quality of a display appearance may decrease. In some embodiments, the temperature map may contribute to an aging determination for each OLED. Temperature and usage histories may be recorded in memory and used to determine the aging of each OLED or portion of the display.

Controllers may determine compensations for each OLED such that the light emitted from each OLED substantially matches the light target for each OLED. In some embodiments, compensations may be based on comparing the aging determination with calibration curves, tables, algorithms, or the like stored in memory. Controllers may adjust the driving strength for each OLED to emit light with the target properties to compensate for the affects of operating temperature and/or aging. This adjustment may prolong the useful life of a display and maintain a desirable display appearance for longer than would otherwise be possible.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
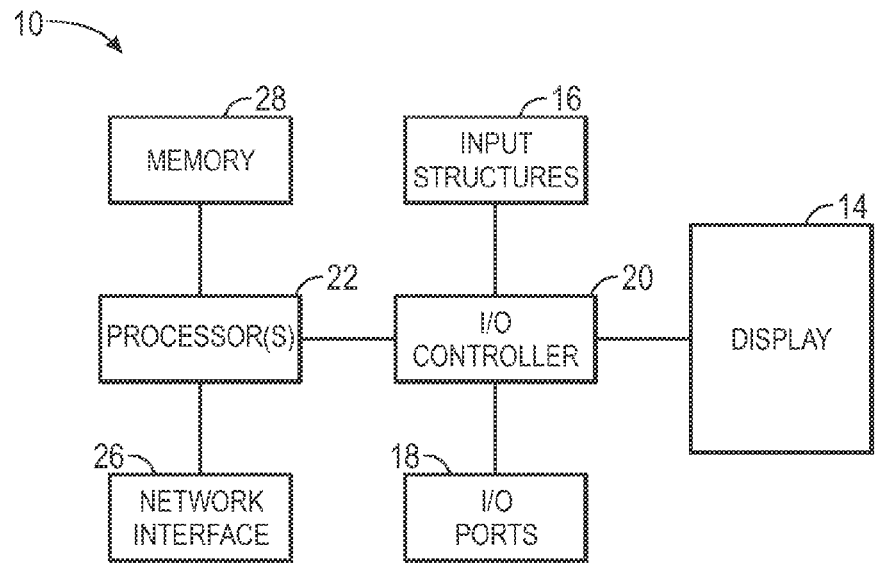
FIG. 1 is a block diagram of an electronic device with an electronic display and its components, in accordance with aspects of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features The present disclosure is directed to systems, displays, and techniques integrating thermal sensors with an electronic display to control portions of the display and/or components beneath a display differentially based at least in part on temperature measurements from the thermal sensors. OLED displays use an array of OLEDs to show an image across the display. Each OLED emits light of a certain color and brightness based on its driving conditions and structure. These systems, displays, and techniques may be used to improve the appearance of a display by compensating OLEDs for changes in brightness and/or color.

The color and brightness of an OLED is not constant over time under the same driving conditions. The properties of light emitted by an OLED may be dependent upon the operating temperature. Thermal sensors integrated within an OLED display may measure the operating temperature so that controllers may make compensations to the driving conditions to counter the temperature effects. In some embodiments, thermal sensors are disposed in the display with the OLEDs such that each OLED may be compensated according to its measured operating temperature. In other embodiments, thermal sensors may be disposed in the display with groups of OLEDs across the display. The temperature measurements from thermal sensors across the display may be used to generate a temperature map to indicate temperatures across the display.

The temperature map also may be utilized to determine the heat generated by components beneath a display. In some embodiments, a controller may adjust the operation of a component to change the temperature of particular zones. In a certain embodiment, the controller slows down the component. In another embodiment, the controller adjusts a signal strength.

Even if all OLEDs of a display are adequately compensated for operating temperature, the aging of OLEDs may also affect the properties of light emitted by the OLEDs. Furthermore, temperature affects aging. Temperatures recorded over time from a temperature map may create a temperature history (e.g. a running average temperature) for each OLED, and the temperature history may be stored in memory. A usage history stored in memory may include the total operation time for each OLED. The temperature and usage histories may be used to determine the degree of aging for each OLED. Controllers may then make compensations to the driving strengths of each OLED based on the determined degree of aging. In some embodiments, sufficient compensation results in a substantially uniform display appearance regardless of variations in operating temperature or aging across the display.

In some embodiments, the driving strengths may be adjusted by manufacturing settings, user input, and/or transmitted information from sensors such as thermal sensors. In some embodiments, calibration curves may be employed to adjust the driving strengths of OLEDs or portions of the display to compensate for operating temperature and/or aging effects.

A variety of electronic devices may incorporate the electronic displays with integrated thermal sensors mentioned above. One example appears in a block diagram of FIG. 1, which describes an electronic device 10 that may include, among other things, one or more processors 22 (e.g. central processing unit (CPU), graphical processing unit (GPU)), memory 28, a display 14, input structures 16, an input/output (I/O) controller 20, I/O ports 18, and/or a network device 26. The various functional blocks shown in FIG. 1 may include hardware, executable instructions, or a combination of both. In the present disclosure, the processor(s) 22 and/or other data processing circuitry may be generally referred to as "data processing circuitry." This data processing circuitry may be embodied wholly or in part as software, firmware, hardware, or any combination thereof. Furthermore, the data processing circuitry may be a single, contained processing module or may be incorporated wholly or partially within any of the other elements within the electronic device 10.

As shown in FIG. 1, the processor(s) 22 and/or other data processing circuitry may be operably coupled with the memory 28. In this way, the processor(s) 22 may execute instructions to carry out various functions of the electronic device 10. Among other things, these functions may include generating image data to be displayed on the display 14. The programs or instructions executed by the processor(s) 22 may be stored in any suitable article of manufacture that includes one or more tangible, computer-readable media at least collectively storing the instructions or routines, such as the memory 28. The memory 28 may represent, for example, random-access memory, read-only memory, rewritable flash memory, hard drives, and optical discs.

The depicted electronic device includes a display 14, such as an OLED display. In accordance with certain embodiments, the display 14 may include or be provided in conjunction with touch sensitive elements. Such a touch-sensitive display may be referred to as a "touch screen" and may also be known as or called a touch-sensitive display system. For example, the display 14 may be a MultiTouch™ touch screen device that can detect multiple touches at once.

Figure 2:
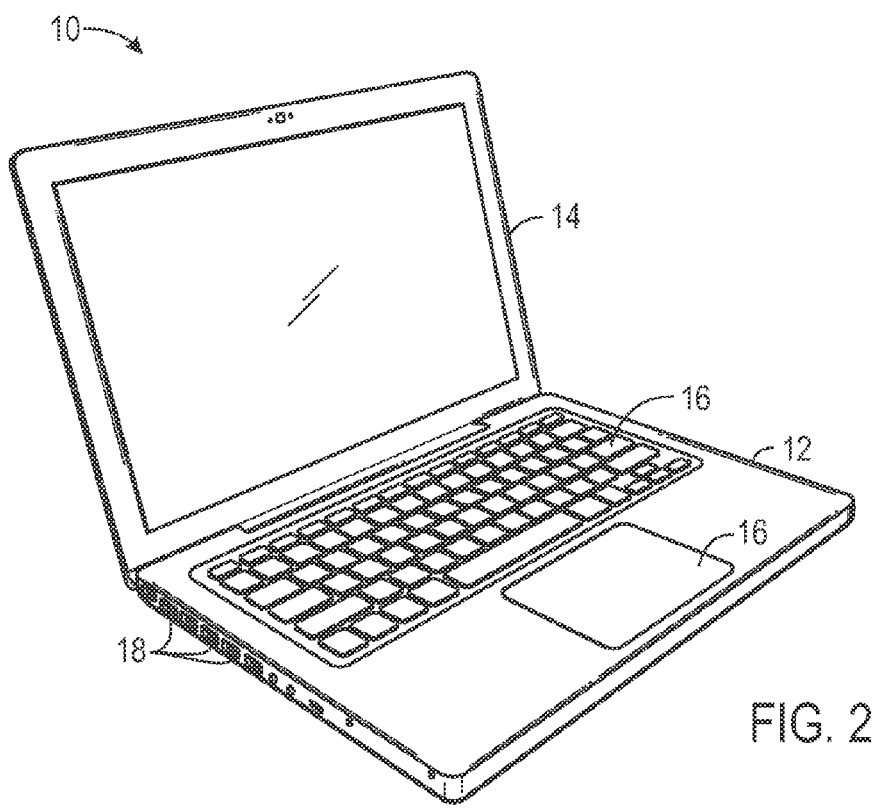
FIG. 2 is a perspective view of an example of the electronic device of FIG. 1 in the form of a computer, in accordance with aspects of the present disclosure.
Figure 3:
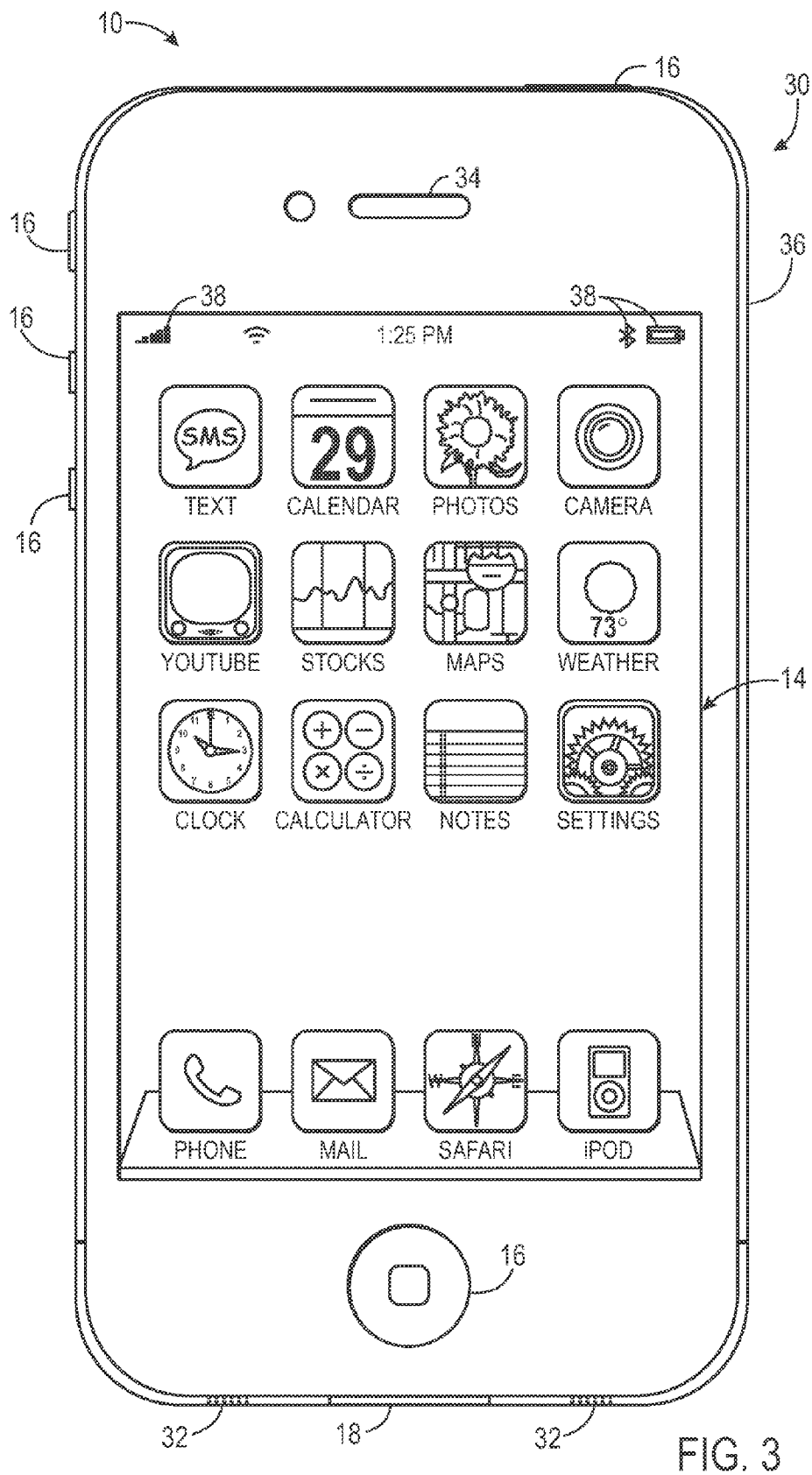
FIG. 3 is a front view of an example of the electronic device of FIG. 1 in the form of a handheld device, in accordance with aspects of the present disclosure.

FIG. 1 is merely one example of a particular implementation and is intended to illustrate the types of components that may be present in electronic device 10. These components may be found in various examples of the electronic device 10. By way of example, the electronic device 10 of FIG. 1 may represent a block diagram of a computer as depicted in FIG. 2, a handheld device as depicted in FIG. 3, or similar devices. Such electronic devices as depicted in FIG. 2 may include a model of a MacBook®, a MacBook® Pro, MacBook Air®, iMac®, Mac® mini, or Mac Pro® available from Apple Inc. of Cupertino, Calif.

As illustrated in FIG. 2, electronic device 10 includes housing 12 that supports and protects interior components, such as processors, circuitry, and controllers, among others, that may be used to generate images to display on display 14. Housing 12 also allows access to user input structures 16, such as a touch screen, keypad, track pad, and buttons that may be used to interact with electronic device 10. For example, user input structures 16 may be manipulated by a user to operate a graphical user interface (GUI) and/or applications running on electronic device 10. In certain embodiments, input structures 16 may be manipulated by a user to control properties of display 14, such as the brightness or color. The electronic device 10 also may include various I/O ports 18 that allow connection of device 10 to external devices, such as a power source, printer, network, or other electronic device.

The electronic device 10 may also take the form of a handheld device 30, as generally illustrated in FIG. 3. The handheld device 30 may represent, for example, a portable phone, a media player, a personal data organizer, a handheld game platform, or any combination of such devices. By way of example, the handheld device 30 may be a model of an iPod® or iPhone® available from Apple Inc. of Cupertino, Calif. In other embodiments, the handheld device 30 may be a tablet-sized embodiment of the electronic device 10, which may be, for example, a model of an iPad® available from Apple Inc.

The handheld device 30 may include an enclosure 36 to protect interior components from physical damage and to shield them from electromagnetic interference. The enclosure 36 may surround the display 14, which may display indicator icons 38. The indicator icons 38 may indicate, among other things, a cellular signal strength, Bluetooth connection, and/or battery life. The I/O interfaces 18 may open through the enclosure 36 and may include, for example, a proprietary I/O port from Apple Inc. to connect to external devices. User input structures 16 in combination with the display 14, may allow a user to control the handheld device 30. A microphone 32 may obtain a user's voice for various voice-related features, and a speaker 34 may enable audio playback and/or certain phone capabilities.

Figure 4:
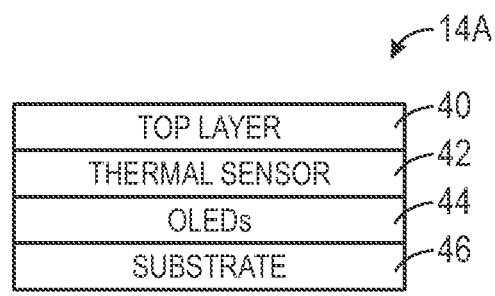
FIG. 4 is a cross-sectional side view of a portion of an OLED having a thermal sensor disposed over an OLED device, in accordance with aspects of the present disclosure.
Figure 5:
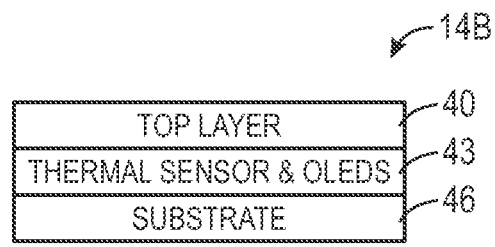
FIG. 5 is a cross-sectional side view of a portion of an OLED having a thermal sensor in the OLED layer, in accordance with aspects of the present disclosure.
Figure 6:
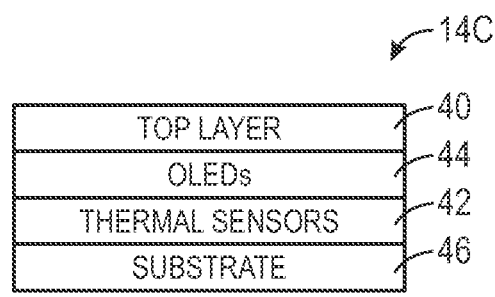
FIG. 6 is a cross-sectional side view of a portion of an OLED having a thermal sensor disposed beneath an OLED device, in accordance with aspects of the present disclosure.

The cross-sectional side views of portions of OLED displays shown in FIGS. 4-6 may be incorporated in any electronic device 10, including a computer or handheld device 30 as described above. Portions of different embodiments of OLED displays with integrated thermal sensors are illustrated in FIGS. 4-6 and may generally be referred to as displays 14A, 14B, and 14C. It may be appreciated that the OLED layer 44 typically has many components, such as an anode, cathode, and one or more organic layers disposed between the anode and cathode. Upon application of an appropriate voltage to the OLED layer 44, positive and negative charges combine in the organic layer(s) to emit light. The characteristics of this light, including brightness and color, depend at least in part on the applied voltage and properties of the organic layer(s).

As illustrated in FIG. 4, an embodiment of an OLED display 14A may include multiple layers. The OLED layer 44 may be disposed over a substrate 46 and a top layer 40 may be disposed over the OLED layer 44. The substrate 46 may include glass, plastic, other suitable materials, or combinations thereof, and may be either a rigid or flexible material. Further, in different embodiments the substrate 46 may be opaque, reflective translucent, or transparent. The top layer 40 may form an environmental barrier to lessen the exposure of the OLED layer 44 to environmental elements such as air, oxygen, water, oils, radiation, and other elements with negative effects on the OLED layer 44. In some embodiments, the top layer 40 may also protect the OLED layer 44 from direct environmental contact and shock. The top layer 40 may include glass, plastic, other suitable materials, or combinations thereof, and may be either a rigid or flexible material.

OLED displays may be categorized as bottom or top emission. In bottom emission OLED displays, the OLEDs emit light toward and through the substrate 46. Bottom emission may require a transparent or semi-transparent substrate 46 and bottom electrode so that emitted light may pass through both layers. Top emission OLED displays include OLEDs that emit light opposite the substrate 46. The substrate 46 of a top emission OLED display may be opaque, reflective, translucent, or transparent.

The OLED display 14A may also include a sensor layer 42. The sensor layer 42 may include sensors such as thermal sensors, thermocouples, thermistors, resistance thermometers, or combinations thereof. In some embodiments, a thermal-sensing OLED display 14A may include a sensor layer 42 disposed between the OLED layer 44 and the top layer 40. The sensor layer 42 may be substantially transparent in the OLED display 14A, such that light emitted by the OLED layer 44 may transmit through the sensor layer 42 and out of the OLED display 14A. In another embodiment as illustrated in FIG. 5, the sensors and OLEDs may be on the same layer 43 between the substrate 46 and the top layer 40 of the display 14B. In such an embodiment, the thermal sensors may be fabricated with the OLEDs during the thin film transistor (TFT) fabrication process or another process. In yet another embodiment as illustrated in FIG. 6, the sensor layer 42 may be disposed directly over the substrate 46 and beneath both the OLED layer 44 and top layer 40 of the OLED display 14C. In other embodiments, sensors may be disposed in multiple layers.

Some groups of OLEDs, called pixels, within the OLED layer 43 and 44 may emit complementary colors of light (e.g., red, green, blue, cyan, magenta, yellow) that may be combined to produce various colors of light, including substantially white light. However, different light sources may not produce the same shade of white. A white point of a light source is a set of chromaticity values used to compare light sources. The white point of a light source is associated with its color and its component lights. With respect to pixels of combined OLEDs, the required driving strength for each component color to maintain a white point may change due to numerous factors, including temperature and use.

Figure 7:
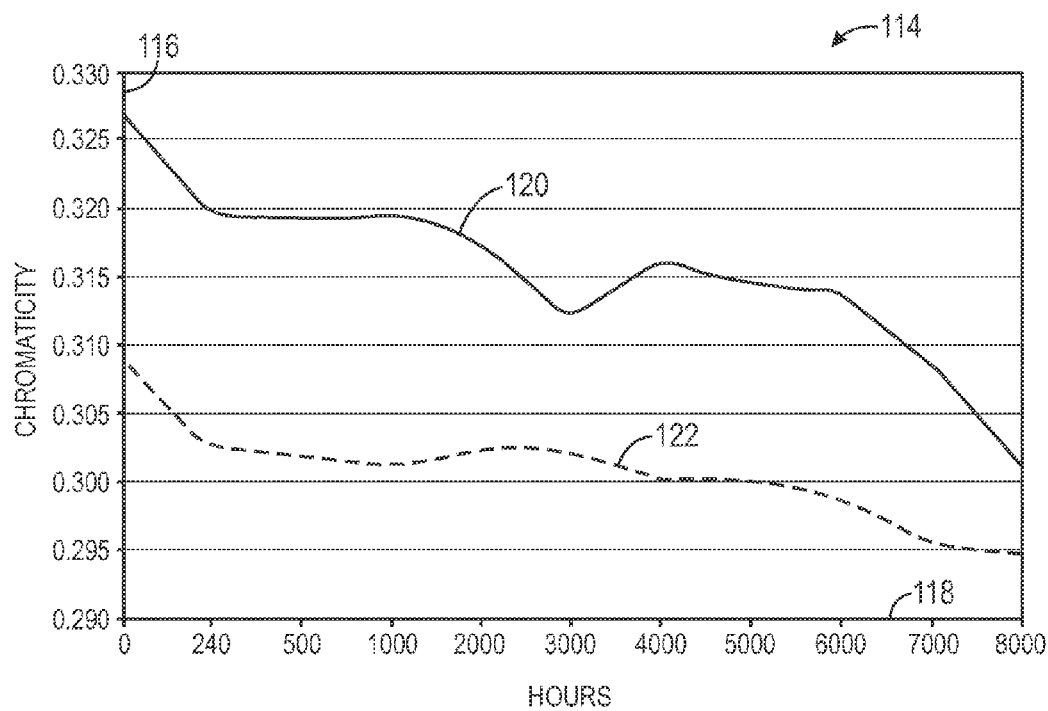
FIG. 7 is a chart depicting the effects of aging on a white point of an OLED, in accordance with aspects of the present disclosure.

As a further complication, OLEDs of different colors may not have the same usage profiles. For example, the brightness of blue OLEDs may decrease more quickly than the brightness of red OLEDs operated for the same length of time. Furthermore, the color of light emitted from an OLED may shift over time. By way of example, FIG. 7 depicts chart 114 that illustrates how the chromaticity of a yellow OLED may shift over time as the OLED ages. Specifically, chart 114 illustrates the change in chromaticity for a light that includes a yellow phosphor OLED. Chromaticity may be defined by set of x and y chromaticity values corresponding to the x-axis and y-axis respectively of a color space chromaticity diagram. In the chart 114, the y-axis 116 shows the chromaticity values, and x-axis 118 shows the operational life of the light in hours. The x chromaticity values are shown by curve 120, and they chromaticity values are shown by curve 122. As shown by curve 120, the x values may generally shift from red to blue with use. As shown by curve 122, the y values may generally shift from yellow to blue with use. Overall, the white point of this light may shift towards a bluish tint.

Figure 8:
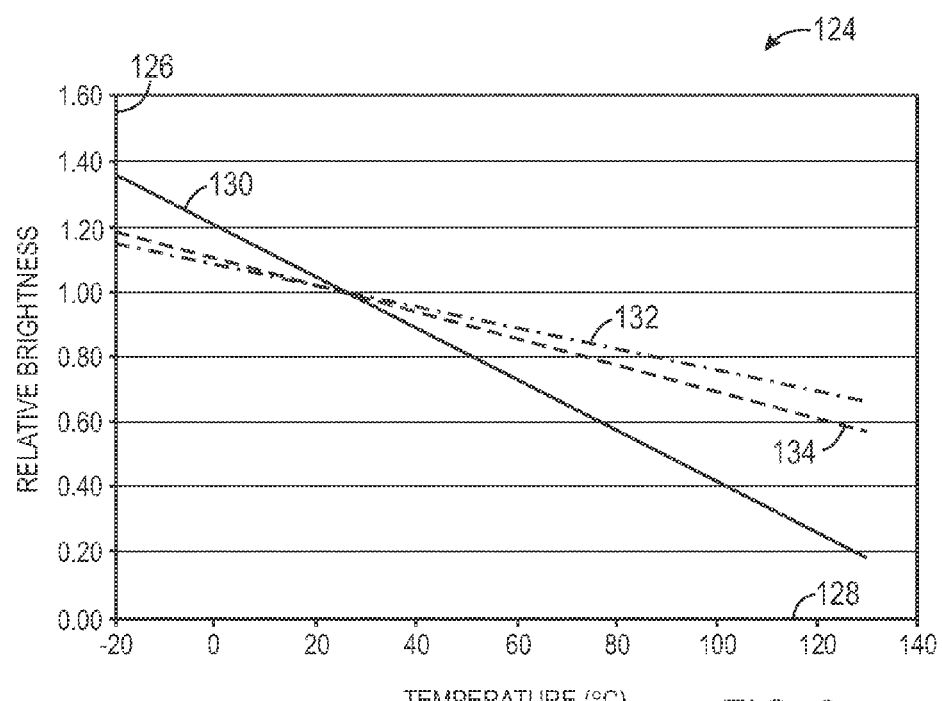
FIG. 8 is a chart depicting the effects of temperature on OLED chromaticity, in accordance with aspects of the present disclosure.

Furthermore, OLEDs of different colors may not have the same temperature profiles either. As an example, the brightness of red OLEDs may decrease at high temperatures more than blue OLEDs at the same temperatures. High temperatures may also accelerate aging shifts in brightness or color. FIG. 8 depicts chart 124 that illustrates how the brightness of different colored OLEDs may change with temperature. The y-axis 126 indicates the relative flux of the OLEDs, and the x-axis indicates the temperature 128 in degrees Celsius. In general, the flux may be the relative percentage of the total amount of light from an OLED. Separate lines 130, 132, and 134, each correspond to different color OLEDs, normalized to 25 degrees Celsius. Specifically, line 130 represents the change in flux for a red OLED, line 132 represents the change in flux for a blue OLED, and line 134 represents the change in flux for a green OLED. The flux generally decreases as the temperature increases, and the rate of decrease in the flux varies between different color OLEDs. The differing rates of change may cause a shift in the white point. For example, the white point of a pixel may shift with increased temperature because the relative flux of the OLEDs within the pixel may change.

Figure 9:
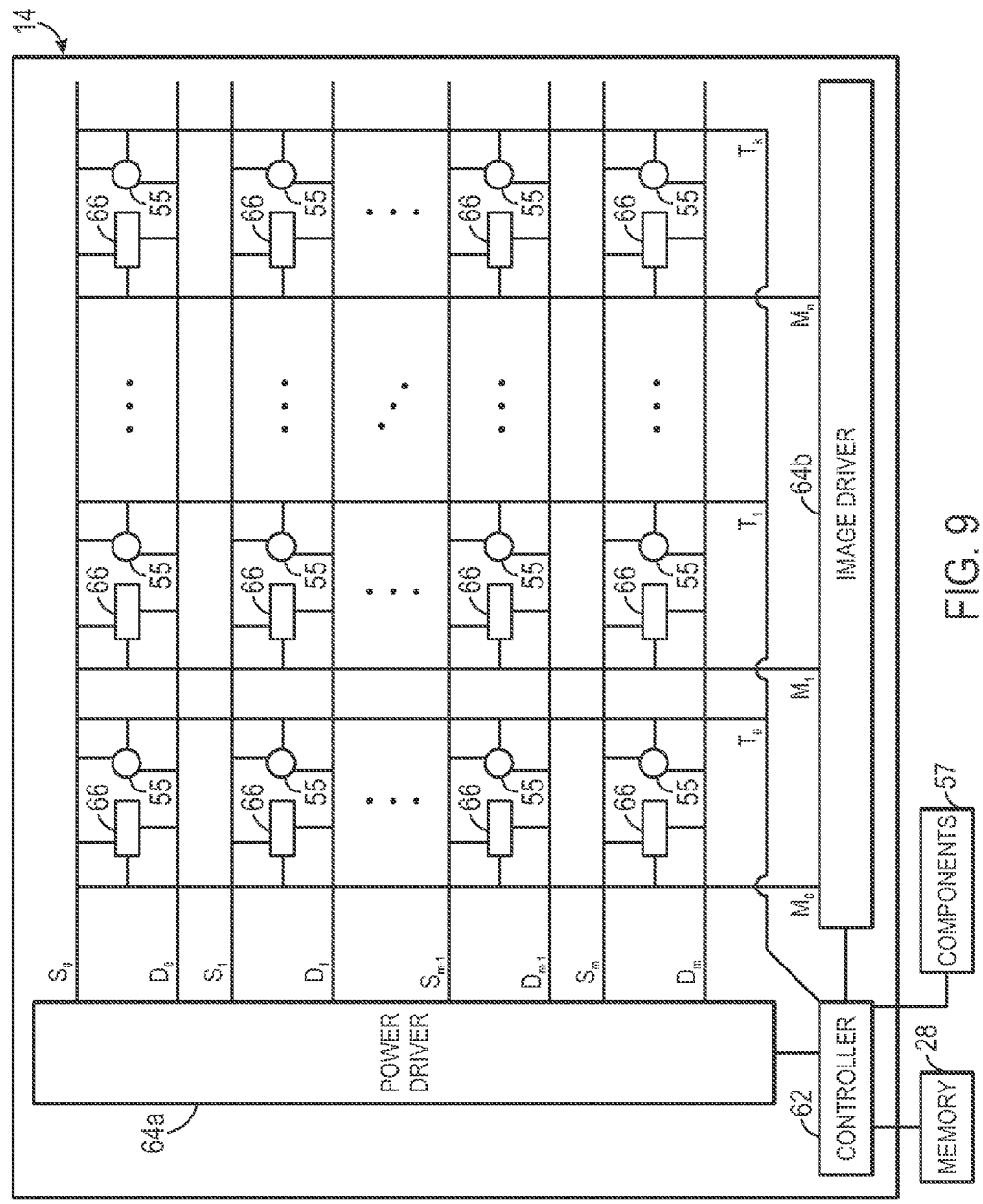
FIG. 9 is a schematic of an OLED array with a thermal sensor for each OLED, in accordance with aspects of the present disclosure.

To address these concerns, FIG. 9 illustrates a display 14 having an array of OLEDs 66, thermal sensors 55, a power driver 64a, an image driver 64b, a controller 62, and possibly other components. The OLEDs 66 are driven by the power driver 64a and image driver 64b (collectively drivers 64). Each power driver 64a and image driver 64b may drive one or more OLEDs 66. In some embodiments, the drivers 64 may include multiple channels for independently driving multiple OLEDs 66 with one driver 64.

The power driver 64a may be connected to the OLEDs 66 by way of scan lines $S_0, S_1, \ldots S_{m-1}$, and $S_m$ and driving lines $D_0, D_1, \ldots D_{m-1}$, and $D_m$. OLEDs 66 receive on/off instructions through the scan lines $S_0, S_1, \ldots S_{m-1}$, and $S_m$ and generate driving currents corresponding to data voltages transmitted from the driving lines $D_0, D_1, \ldots D_{m-1}$, and $D_m$. The driving currents are applied to each OLED 66 to emit light according to instructions from the image driver 64b through driving lines $M_0, M_1, \ldots M_{n-1}$, and $M_n$. Both the power driver 64a and the image driver 64b transmit voltage signals through respective driving lines to operate each OLED 66 at a state determined by the controller 62 to emit light. Each driver may supply voltage signals at a duty cycle and/or amplitude sufficient to operate each OLED 66.

Drivers 64 may include one or more integrated circuits that may be mounted on a printed circuit board and controlled by controller 62. Drivers 64 may include a voltage source that provides a voltage to OLEDs 66 for example, between the anode and cathode ends of each OLED layer. This voltage causes current to flow through the OLEDs 66 to emit light. Drivers 64 also may include voltage regulators. In some embodiments, the voltage regulators of the drivers 64 may be switching regulators, such as pulse width modulation (PWM) or amplitude modulation (AM) regulators. Drivers 64 using PWM adjust the driving strength by varying the duty cycle. For example, the OLED controller 62 may increase the frequency of a voltage signal to increase the driving strength for an OLED 66. Drivers 64 using AM adjust the amplitude of the voltage signal to adjust the driving strength.

Each OLED 66 may emit light at an original brightness and original color when driven with an original drive strength. When the drive strength is adjusted, like by PWM or AM, the light emitted from an OLED 66 will vary from the original brightness and original color. For example, the duty cycles for individual OLEDs 66 may be increased and/or decreased to produce a color or brightness that substantially matches a target color or brightness for each OLED 66. Furthermore, over time, the color and brightness of emitted light from an OLED will also vary due to temperature and age even when driven with the original drive strength. In some embodiments, a controller 62 may adjust the drive strength of an OLED 66 throughout its useful life such that the color and/or brightness of its emitted light remains substantially the same, or at least the same relative to other OLEDs 66 of the display 14.

OLED controller 62 may adjust the driving strength by changing the drive instructions given to the drivers 64. Specifically, controller 62 may send control signals to drivers 64 to vary the voltage and/or the duty cycle applied to certain OLEDs 66. For example, controller 62 may vary the voltage applied by drivers 64 to an OLED 66 to control the brightness and/or the chromaticity of that OLED 66. By increasing the voltage applied to an OLED 66, the brightness of that OLED 66 increases. In contrast, decreasing the voltage applied to an OLED 66 decreases its brightness. In other embodiments, the ratio of the voltages applied to a group of OLEDs may be adjusted to substantially match the brightness of other OLEDs while maintaining a relatively constant color.

OLEDs 66 may be arranged in groups within the display to form pixels. Pixels may include groups of OLEDs 66 (e.g., three or four) emitting different colors, particularly complementary colors such as red, cyan, green, magenta, blue, yellow, white, and combinations thereof. These light colors from each OLED 66 may be mixed according to instructions from the controller 62 to create specific colors, including white, for each pixel. Together, the specific colors for each pixel of the display 14 form an image on the display 14. The driving strength of some or all of the OLEDs 66 may be adjusted to achieve a uniform appearance for the display 14. An ideal uniform display 14 may be such that if each pixel was instructed to emit light of the same color and brightness, a user would not perceive color or brightness variations across the display 14. Rather, the entire display would have substantially the same color and brightness as perceived by the user.

In some embodiments, thermal sensors 55 may be disposed in the display 14 with the OLEDs 66 to provide the controller 62 with the operating temperature of OLEDs 66. Thermal sensors 55 are coupled to the OLED controller 62 by way of thermal sensor lines $T_0, T_1, \ldots T_k$. In some embodiments as shown in FIG. 9, each thermal sensor 55 may be disposed in the display 14 with an OLED 66 in a 1:1 ratio. Each thermal sensor 55 measures the operating temperature of the OLEDs 66 and transmits this measurement to the controller 62. The controller 62 may store the measured operating temperature in memory 28. In some embodiments, the controller 62 may store parameters of the temperature history such as the maximum operating temperature, minimum operating temperature, running average temperature of the thermal sensor 55 during operation, the duration of operation of OLEDs 66 above threshold temperatures, or combinations thereof.

The controller 62 may govern operation of a driver 64 using information stored in memory 28. For example, memory 28 may store values defining the target brightness and/or color of each OLED 66, as well as calibration curves, tables, algorithms, or the like. The memory 28 may also store values defining driving strength adjustments that may be made to compensate for a shift in the emitted brightness and/or color. In some embodiments, the controller 62 may dynamically adjust driving strengths throughout operation of the display 14 to maintain a light output that matches the target brightness or color for each OLED 66. The operating temperature, temperature history, and usage history of each OLED 66 may cause the emitted color or brightness of each OLED 66 to fail to match the target brightness or color unless these effects are compensated.

The controller 62 may determine compensation adjustments to each OLED 66 based on a comparison of the measured operating temperature and calibration curves, tables, algorithms, or the like stored in memory 28. In some embodiments, the compensations may change the brightness and/or color of light emitted by each OLED 66 to match the brightness and/or color target for that OLED 66. The controller 62 may also generate a temperature map from the measured operating temperatures to identify measured operating temperatures across the display. The temperature map may indicate various temperature parameters across the display including actual operating temperatures, relative temperatures, changing temperatures, temperature history (e.g., running average temperature) etc. The controller 62 may utilize the temperature map to adjust the driving strength of each OLED 66 to compensate for shifts in the color and/or brightness due to temperature affects. In some embodiments, adjustments may be made to the whole display. In other embodiments, adjustments may be made to only certain parts of the display that are more affected by temperature and/or age. For example, the adjustments made by controller 62 may change the location that an image is shown on a display 14. The image location may be changed to an area of the display with different temperature map characteristics, such as moving an image to be shown by OLEDs 66 with a lower or more uniform temperature.

Figure 10:
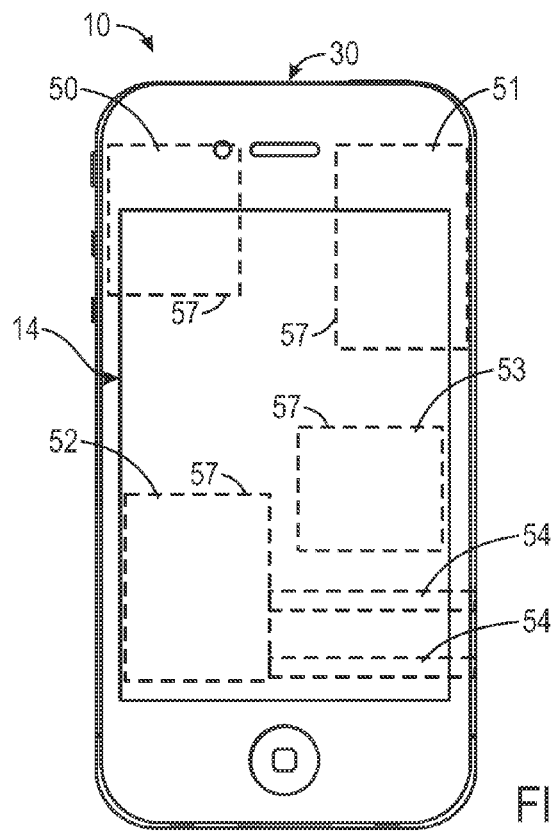
FIG. 10 is a front view of the placement of components within an electronic device, in accordance with aspects of the present disclosure.

The thermal sensors 55 integrated in the display 14 may measure the operating temperature of OLEDs 66 due to both the ambient environment and environment within the electronic device 10. In the embodiment shown in FIG. 10, components 57 within a handheld device 30 are shown beneath display 14. Due to the display 14 covering much of the surface area of one side of the handheld device, many components 57 lie entirely or at least partially beneath a portion of the display 14. Components 57 may include, but are not limited to, a radio frequency (RF) transmitter 50, a battery 51, CPU 52, GPU 53, and heat sinks 54. A RF transmitter 50 may send and receive electromagnetic signals for many applications, including phone calls, internet browsing, Bluetooth connectivity, etc. A battery 51 powers the components of the handheld device 30. A CPU 52 may perform a myriad of processing functions for the handheld device 30. A GPU 53 may process graphics to be displayed on display 14. Heat sinks 54 may be physically coupled to a number of components 57 to dissipate heat.

Figure 11:
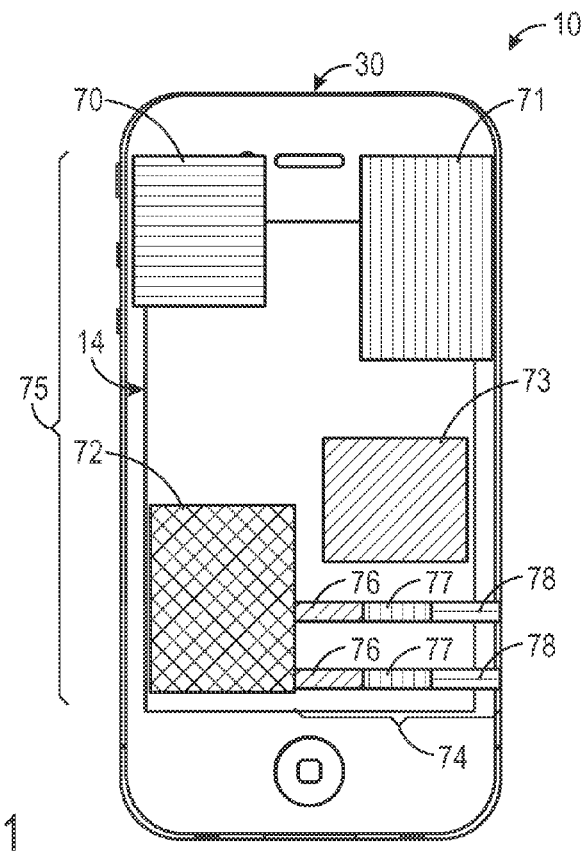
FIG. 11 is a graphical representation of a temperature map of a display over the components placed as shown in FIG. 10, in accordance with aspects of the present disclosure.

During user operation of the handheld device 30, components 57 will be used in varying amounts. Current flows through components 57 may generate heat through resistance heating, warming components and portions of the display 14. Some components 57, such as heat sinks 54, may be physically coupled rather than electrically coupled to other components 57. Such physically coupled components 57 may not generate heat themselves, but may conduct heat from one warm component 57 to another cooler area of the handheld device 30. Thermal sensors 55 integrated across the display 14 may measure the operating temperature of the OLEDs 66 of the above display 14. As shown in FIG. 11, temperature measurements may be used to generate a temperature map 75 of the display 14, which may contribute to the temperature history for each OLED 66 of the display 14. In an embodiment, the temperature map 75 may be shown on the display 14.

In an embodiment, current flows and heat generation may not be the same from one component 57 to another. Some components 57 may draw more current, thus generating more resistance heat, than others during certain user operations. For example, a user that primarily uses the handheld device 30 for phone calls or Internet downloads may utilize the RF transmitter 50 more than another user that primarily listens to music stored on the handheld device. As another example, a user may use applications that place heavy demands on the CPU 52 but not the GPU 53, while another user may use applications (e.g., games) that are graphically intense 53 but do not utilize the CPU 52 as much. The actual end use of the handheld device may vary from one user to another, resulting in differential temperatures across the display 14 at any given time and historically. Accordingly, temperature maps 75 will vary according to use.

An example of a temperature map 75 that corresponds to heavy CPU 52 usage and relatively light RF transmitter 50 usage of a hypothetical electronic device 10 is shown in FIG. 11. As discussed above, the controller 62 may store measured temperatures from the thermal sensors 55 to generate the temperature map 75. The temperature map 75 illustrated here indicates the recorded running average operating temperatures across the display 14. The temperature map 75 may convey the running average temperatures for each OLED 66 or for groups of OLEDs 66 (e.g., one or more pixels). For example, the average temperatures of the display 14 from warmest to coolest shown here may be the CPU temperature profile 72, followed by the GPU temperature profile 73, battery profile 71, and RF transmitter profile 70. In an embodiment, each temperature profile 70, 71, 72, 73, and 74 may closely correspond to the locations of components within the handheld device 30 (e.g., FIG. 10). Temperature profiles related to particular components 57 may not be uniform. For example, heat may be localized within a component 57. In an embodiment, the heat sink profile 74 illustrates heat conducted away from the warmest components 57. The heat sink portion 76 nearest to the CPU 52 may be warmer than the heat sink portions 77 and 78 further from the CPU 52.

As discussed above, in an embodiment, the controller 62 (FIG. 9) may utilize the temperature map 75 to determine the compensation for OLEDs 66 to counter color and/or brightness shifts due to the measured operating temperature. In another embodiment, the temperature map 75 may be utilized to estimate the temperature of each component 57 beneath the display. The controller 62 may adjust the operation of a component 57 based on its affect on the operating temperature of certain OLEDs 66. For example, the temperature map 75 above the CPU 52 may indicate an increased operating temperature, affecting light emitted by the OLEDs 66 above the CPU. Based on the temperature map 75, the controller 62 may slow the CPU 52 to lower the operating temperature for the OLEDs 66 above the CPU 52. This may compensate for a shift in brightness and/or color of some OLEDs 66 by lowering the temperature without changing the driving strengths of those OLEDs 66. In some embodiments, the controller 62 may adjust both the driving strengths of OLEDs 66 and the operation of components 57 based on the temperature map 75. For example, the controller 62 may slow the CPU 52 and increase the driving strength for OLEDs 66 above the CPU to compensate for shifts in the brightness and/or color of those OLEDs 66

In some embodiments, the controller 62 may store a usage history in memory 28. Whereas the temperature history may pertain to measured temperatures by the thermal sensor 55 disposed across the display 14, the usage history may pertain to the measured use of OLEDs 66 disposed across the display 14. For example, the controller 62 may store the operating hours and/or drive strengths applied to the OLEDs 66 as usage history.

The controller 62 may use the temperature history and usage history of OLEDs 66 to determine the aging of each OLED 66. Because temperature may affect the rate of aging through use, the controller 62 may determine the amount of aging due to temperature. The controller 62 may also determine compensation adjustments to the driving strengths for each OLED 66 based on a comparison of the degree of aging with calibration curves, tables, algorithms, or the like stored in memory 28. In some embodiments, the controller 62 may make driving strength adjustments to each OLED 66 based on its age alone to compensate for shifts in color and/or brightness. Without such adjustments, outlines of components 57 may become visible on the display 14 over time as certain OLEDs 66 age faster, negatively affecting the appearance of the display 14.

In other embodiments, the controller 62 may make driving strength adjustments to the OLEDs 66 based on the age and present operating temperature of the OLEDs 66. As discussed above, the controller 62 may adjust the driving strengths of OLEDs 66 to compensate for shifts in emitted color and/or brightness. In some embodiments, the controller 62 may make compensations to change the location that an image is shown on a display 14. The image location may be changed to an area of the display with different temperature map aging characteristics, or both. For example, an image to be displayed over part of the RF transmitter 50 may be moved to be displayed over the battery 51 because the OLEDs 66 over the RF transmitter 50 are warmer on average and thus more aged than the OLEDs 66 over the battery 51. In some embodiments, images may be moved across the display 14 to obtain an optimal appearance for an image or to minimize adjustments to OLEDs 66.

Generally, the controller 62 may adjust the driving strength of each OLED 66 to compensate for shifts in color and/or brightness due to measured operating temperature of OLEDs 66, temperature history of OLEDs 66, usage history of OLEDs 66, or combinations thereof. For example, the driving strengths may be adjusted to compensate for both a localized aging and an overall aging of OLEDs 66 across the display. In some embodiments, the controller 62 may make a driving strength adjustment to the differentially aged OLEDs 66 to make the emitted light substantially math other OLEDs 66 or a color and/or brightness target. Alternatively, the controller 62 may make a driving strength adjustment to other less aged OLEDs 66 or to surrounding OLEDs 66 to make a differentially aged OLED 66 less noticeable than before. As another alternative, the controller may make driving strength adjustments to both the more aged OLEDs 66 and the less aged OLEDs 66 to improve the overall viewability of the display. The controller 62 may employ AM, PWM, or other suitable techniques to vary the driving strength.

In some embodiments, each thermal sensor 55 may be disposed in the display 14 with more than one OLED 66. In an embodiment illustrated in FIG. 12, thermal sensors 55 are disposed in zones 60 of the display 14 to measure the temperature of each zone 60. Each zone 60 includes at least one thermal sensor 55 and at least one OLED 66 proximate to the thermal sensor 55. For example, the temperature of each zone 60 across the display 14 may vary, affecting the appearance as discussed above. The thermal sensors 55 may transmit information in the form of an electrical signal in response to measured temperature to a controller 62.

Figure 12:
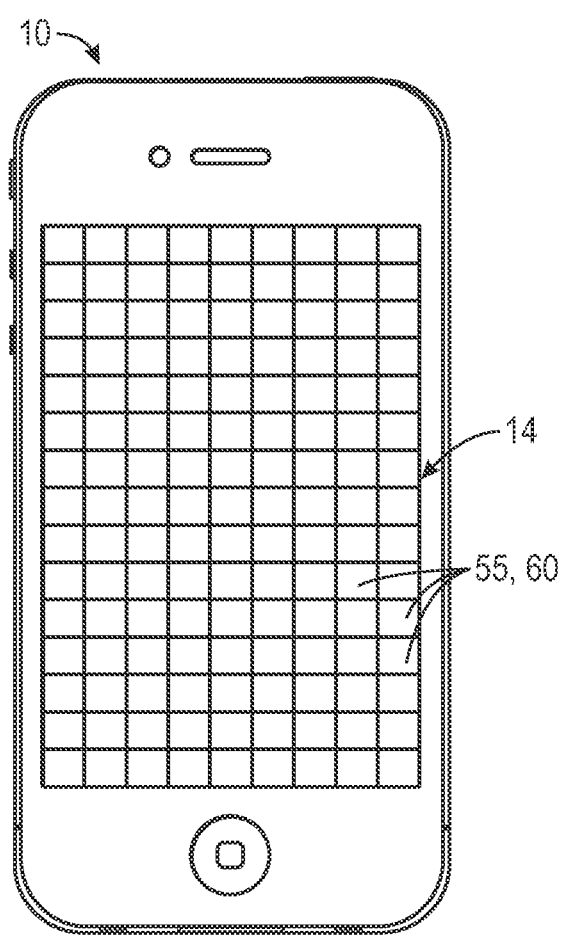
FIG. 12 is a front view of zones across the display of a handheld device, in accordance with aspects of the present disclosure.

The zones 60 may be arranged in a grid or in a matrix over the plane of the display 14 as shown in FIG. 12, but zone arrangements may not be limited to this configuration. In some embodiments, zones 60 may be arranged in strips, circles, or irregular shapes. Zones 60 may be of uniform shape and size across the display 14, or have varied shapes and sizes. In some embodiments, certain areas of the display 14 will have more zones 60 and possibly, more thermal sensors 55 than others areas. The number, size, and shape of zones 60 may affect the resolution of the temperature map 75. For example, zones 60 over components 57 with localized heat sources may be sized smaller so that a more precise temperature map 75 may be measured. Components 57 with substantially uniform temperatures during use may have less zones 60 and possibly less thermal sensors 55. Zones 60 may be defined as having a certain number of OLEDs 66 or as the OLEDs 66 closest to each thermal sensor 55.

Figure 13:
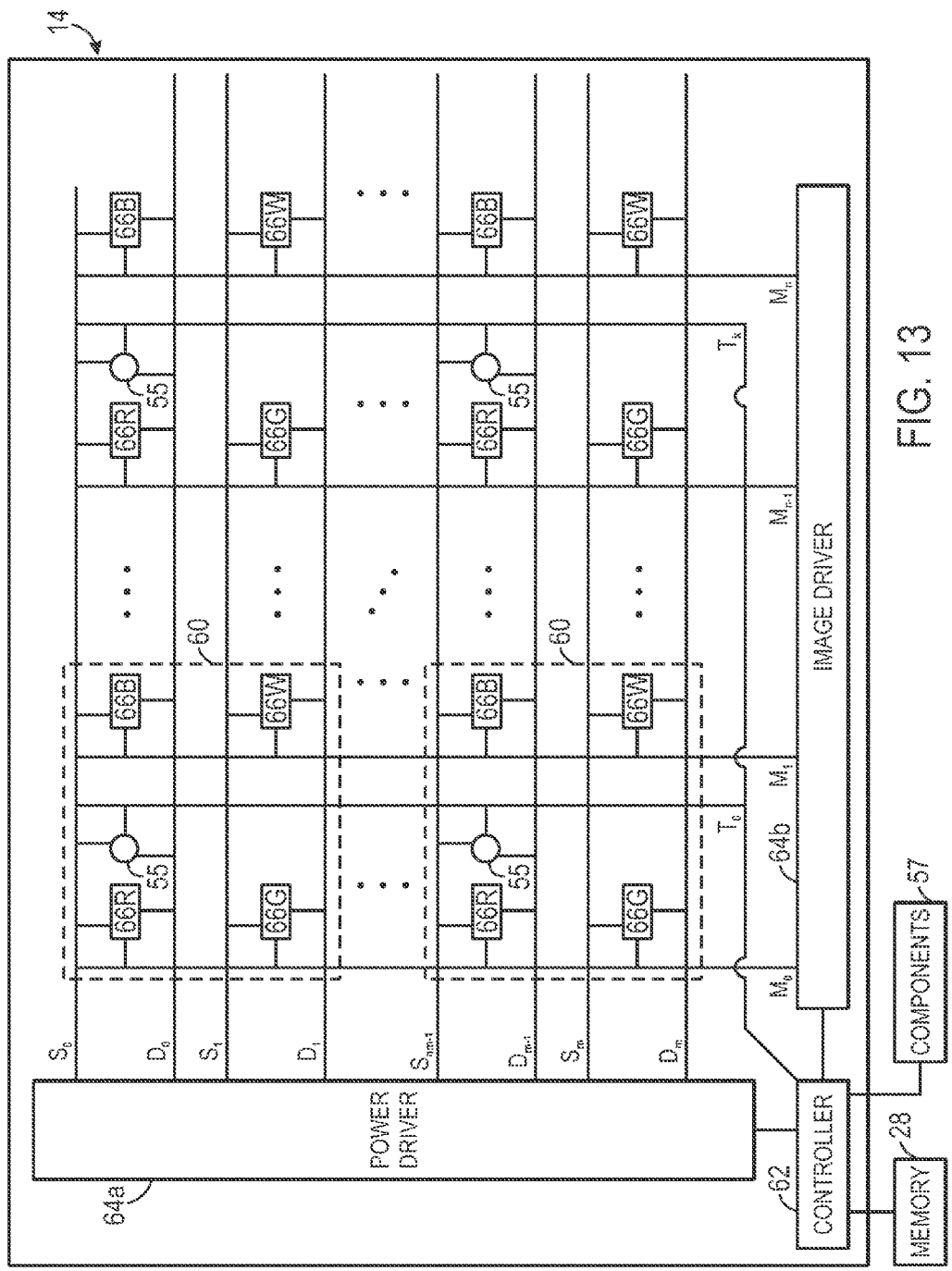
FIG. 13 is a schematic of an OLED array arranged in zones with a thermal sensor disposed in each zone, in accordance with aspects of the present disclosure.

OLEDs 66 and thermal sensors 55 disposed in zones 60 across the display as illustrated in FIG. 13, may also have a power driver 64a, an image driver 64b, a controller 62, and possibly other components. OLEDs 66 may be arranged in zones 60 such that each zone 60 includes a thermal sensor 55. In an embodiment as shown in FIG. 13, each zone 60 may include a sub array of pixels containing a number of red OLEDs 66R, the same number of green OLEDs 66G, the same number of blue OLEDs 66B and the same number of white OLEDs 66W. In such a configuration, the resolution of the temperature map 75 may be determined by dividing the overall display resolution by the number of zones 60. In other embodiments, each zone 60 may include a different number or color set of OLEDs 66.

The OLEDs 66, thermal sensors 55, drivers 64, and controller 62 may function in substantially the same manner as described above with FIG. 9, except that the thermal sensors 55 are disposed with zones 60 of OLEDs 66 rather than with individual OLEDs. Thermal sensors 55 disposed with zones 60 measure the operating temperature of each zone 60, and the controller 62 may generate a temperature map 75 based on these measured zone temperatures. In some embodiments, the controller 62 may make compensation adjustments to the OLEDs 66 within each zone 60 based on the temperature map 75. Adjustments may include adjusting the driving strength of OLEDs 66 in each zone or changing the location of images to be shown on the display. In other embodiments, the controller 62 may adjust the operation of components 57 beneath zones 60 of the display 14. In some embodiments, the controller 62 may adjust both the driving strengths of OLEDs 66 and the operation of components 57.

As described above, the temperature map 75 generated from zone temperatures may be used to determine the temperature history for each zone 60 and the OLEDs 66 within each zone 60. The controller 62 may also determine the aging for OLEDs 66 based on the temperature history and usage history for each zone 60 stored in memory 28. In some embodiments, the controller 62 may adjust the driving strength of OLEDs 66 within each zone 60 based on the determined aging for each zone 60 or OLED 66. In other embodiments, the controller 62 may make compensation adjustments to the OLEDs 66 within each zone 60 based on both the determined aging for each zone 60 or OLED 66 and the temperature map 75.

Figure 14:
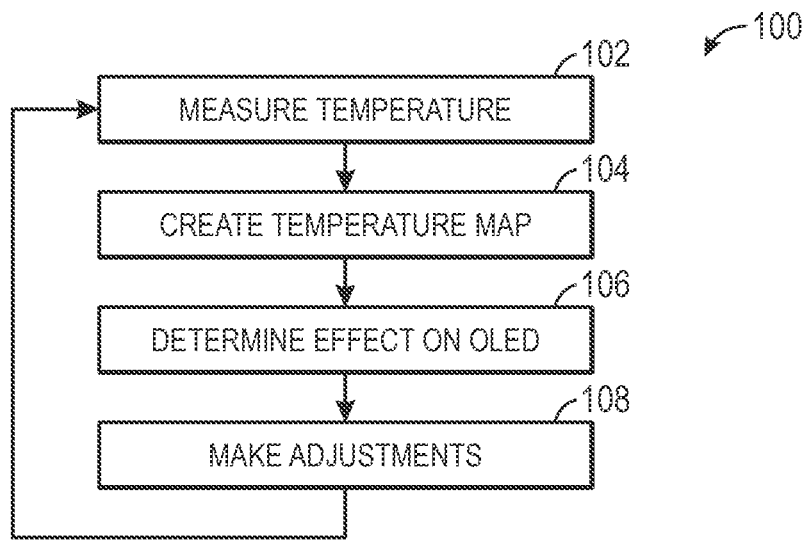
FIG. 14 is a flowchart depicting a method for operating an OLED display to adjust components or OLEDs based on a temperature map, in accordance with aspects of the present disclosure.
Figure 15:
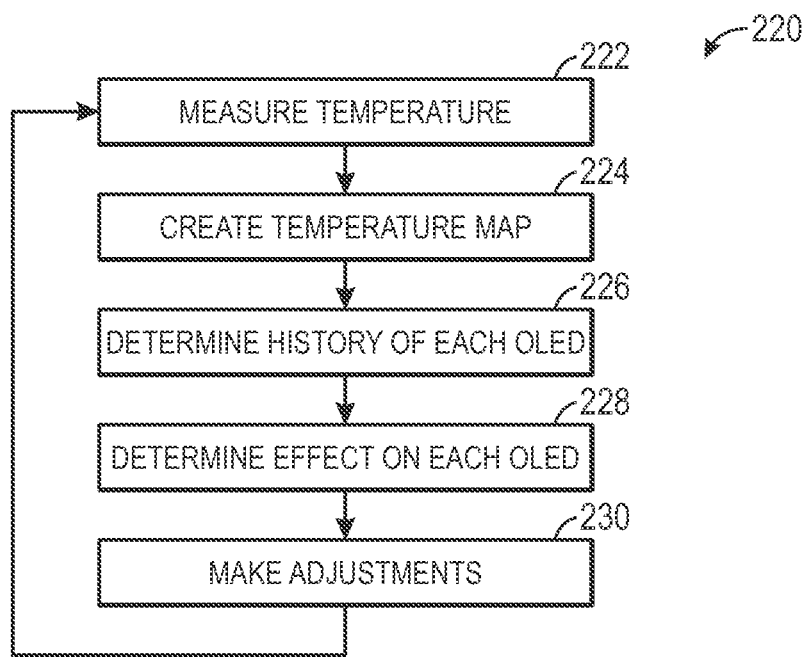
FIG. 15 is a flowchart depicting a method for operating an OLED display to adjust each OLED based on the age of each OLED, in accordance with aspects of the present disclosure.

Methods for operating the above described OLED displays 14 are illustrated in FIGS. 14 and 15. The method 100, as illustrated in FIG. 14, may adjust components 57 or the image shown on the display 14 based on a temperature map 75 of present operating temperatures. The method 100 may be used with displays 14 having thermal sensors 55 disposed with OLEDs 66 in a 1:1 ratio across the display 14 or thermal sensors 55 disposed with zones 60 of OLEDs 66 across the display 14. The thermal sensors 55 first measure (block 102) the temperature at each thermal sensor 55. In some embodiments, this temperature may relate to the operating temperature of each respectively coupled OLED 66. In other embodiments, this temperature relates to the operating temperature of a zone 60 of the display. The thermal sensors 55 transmit temperature information to the controller 62 to process the measured operating temperatures.

The controller 62 receives the temperature information from each thermal sensor 55 and creates (block 104) a temperature map 75 for the display 14. The temperature map 75 may indicate the present operating temperature across the display 14, identifying portions with increased temperatures and localized heat sources. For example, the temperatures may vary across the display 14 due to components 57 beneath the display 14 that warm more than other components 57. As another example, the temperature map 75 may be non-uniform due to localized external heat sources. As discussed above, temperature may affect the color and/or brightness of light emitted by an OLED. The controller 62 may use the temperature map 75 to determine (block 106) which OLEDs 66 or zones 60 may be affected by a present operating temperature beyond a threshold temperature stored in memory 28. OLEDs 66 operating at temperatures beyond a threshold may emit light of a noticeably different color and/or brightness than OLEDs 66 operating below the threshold temperature.

The controller 62 may then make adjustments (block 108) to compensate for the noticeably different color and/or brightness of light emitted from the OLEDs 66 operating beyond a threshold temperature. In some embodiments, the compensation may include adjusting the driving strength for each affected OLED 66 so that the properties of the emitted light substantially matches the targeted emitted light for each respective OLED 66. The compensation may be determined by considering numerous factors, including OLED specific factors like the measured temperature, present drive strength, previous drive strength adjustments, recorded operating hours, and information stored in memory 28 like calibration curves, algorithms, and charts. Based on these factors, the controller 62 may then adjust each OLED 66 for the operating temperature measured by the coupled thermal sensor 55. Furthermore, in certain embodiments, the driving strengths may be adjusted to compensate for both a localized increased temperature and an overall increased temperature across the display 14. Changes in brightness and/or color for each OLED 66 from these adjustments may improve the image quality of a display 14.

In other embodiments, the controller 62 may make adjustments (block 108) to change the location that an image is shown on a display 14. The image location may be changed to an area of the display with different temperature map characteristics, such as lower measured operating temperature. In some embodiments, images may be moved across the display 14 to minimize the total compensation made for OLEDs 66 of the display 14. In other embodiments, images may be moved across the display 14 so that the image shown may substantially match the color and brightness of the target image.

In other embodiments, the controller 62 may determine that the OLEDs 66 operating beyond a threshold temperature and make adjustments (block 108) to lower the heat generated by components 57 beneath these OLEDs 66. As current passes through components 57, resistance heat warms the component 57, which may warm the display 14 and other components 57. The components 57 of an electronic device 10 may generate less heat if operations are slowed or otherwise changed. For example, a CPU 52 operating at 600 MHz may generate more heat than a CPU 52 operating at 400 MHz. As another example, the power of a transmitted signal from the RF transmitter 50 may be reduced so that the RF transmitter 50 generates less heat. In some embodiments, the controller 62 may adjust the operation of one or more components 57 at a time. Furthermore, in some embodiments the controller 62 may adjust the operation of one or more components 57 in addition to adjusting the drive strength of affected OLEDs 66.

The method 220, as illustrated in FIG. 15, may make adjustments to each OLED 66 or the image shown on the display 14 based at least in part on the temperature and usage history of each OLED 66. The method 220 may be used with displays 14 as described above with FIGS. 9 and 13 having thermal sensors 55 disposed with OLEDs 66 in a 1:1 ratio or in zones 60 across the display 14. The thermal sensors 55 first measure (block 222) the temperature at each thermal sensor 55. Thus, the measured temperature may relate directly to the operating temperature of proximate OLEDs 66. The thermal sensors 55 transmit temperature information to the controller 62 to process the measured operating temperatures.

As discussed with the previous method 100, the controller 62 receives the present operating temperature from each thermal sensor 55 and creates (block 224) a temperature map 75 for the display 14. With this method 220, the controller 62 additionally may determine (block 226) the temperature history and usage history of each OLED 66. As discussed above, the temperature history may include the running average operating temperature of OLEDs 66, the duration of operation above threshold temperatures, and the like. The controller 62 may also determine a usage history for each OLED 66 based on the recorded operating hours and driving strengths applied to the OLEDs 66. Both the temperature history and usage history for each OLED 55 may be recorded in memory 28.

Following the determination (block 226) of the temperature history and usage history for each OLED 66, the controller 62 may then determine (block 228) the effect that the parameters operating temperature, temperature history, and usage history have on the emitted light from each OLED 66. The controller 62 may determine the effect of these parameters on the color and/or brightness through comparison of these parameters with calibration curves, algorithms, or charts stored in memory 28.

The controller 62 may then adjust (block 230) the driving strength of each OLED 66 to compensate for shifts in the color and brightness due to aging alone or aging and measured operating temperature of each OLED 66. As discussed above, the controller 62 may adjust driving strengths to both localized portions of the display 14 or the display 14 as a whole based on any of the parameters. The controller 62 may also adjust the operation of components 57 beneath the display 14 based on the temperature history and usage history of OLEDs 66 across the display.

In other embodiments, the controller 62 may change the location that an image is shown on a display 14. The image location may be changed to an area of the display with different aging characteristics, different operating temperature, or both. In some embodiments, images may be moved across the display 14 to minimize the total compensation needed for OLEDs 66 of the display 14. In other embodiments, images may be moved across the display 14 so that the image shown may substantially match the color and brightness of the target image.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A display, comprising:
a plurality of organic light emitting diodes (OLEDs) disposed across the display,
wherein each OLED of the plurality of OLED emits light in response to control signals;
a plurality of thermal sensors disposed across the display, the plurality of thermal sensors being configured to measure a plurality of temperatures across the display and generate signals relating to the measured plurality of temperatures; and
a controller configured to move a location of an image on the display from a first location to a second location based at least in part on the signals relating to the measured plurality of temperatures, and a first average temperature of the first location is greater than a second average temperature of the second location due substantially to heat from electronic components proximate the display.

2. The display of claim 1, wherein the plurality of OLEDs and the plurality of thermal sensors are disposed on a common layer of the display.

3. The display of claim 1, wherein the plurality of OLEDs is disposed on a layer of the display and the plurality of thermal sensors is disposed on a different layer of the display.

4. The display of claim 1, wherein each OLED of the plurality of OLEDs is disposed across the display with a respective thermal sensor of the plurality of thermal sensors in a substantially 1:1 ratio, and the controller is configured to determine the control signals for each OLED based at least in part on the signals relating to the measured temperature of the plurality of measured temperatures from the respective thermal sensor.

5. The display of claim 1, wherein the controller is configured to determine the control signals for the plurality of OLEDs based at least in part on an age of the OLEDs.

6. The display of claim 1, wherein the controller is configured to adjust a brightness or a color of the plurality of OLEDs in a portion of the display based at least in part on a difference between the measured temperature of the portion of the display and the measured temperature of a remainder of the display.

7. The display of claim 1, wherein the controller is configured to determine the control signals for the plurality of OLEDs based at least in part on a running average operating temperature of the OLEDs, a maximum operating temperature, a minimum operating temperature, or any combination thereof.

8. The display of claim 1, wherein the controller is configured to store the plurality of measured temperatures in a memory and determine the control signals for the plurality of OLEDs based at least in part on the measured temperatures stored in memory.

9. The display of claim 1, wherein the controller is configured to determine the control signals for each OLED to compensate for shifts in a color, or a brightness, or a combination thereof.

10. An electronic device, comprising:
a housing;
data processing circuitry disposed within the housing, wherein the data processing circuitry comprises a central processing unit, a graphical processing unit, a radio frequency transmitter, or any combination thereof; and a display comprising a display screen and a controller,
the display screen being coupled to the housing, the display screen comprising:
a plurality of organic light emitting diodes (OLEDs) disposed across the display screen; and
a plurality of thermal sensors disposed across the display, configured to measure a plurality of temperatures across the display and generate signals relating to the measured plurality of temperatures; and
a controller configured to receive image data from the data processing circuitry and to determine control signals for the plurality of OLEDs based at least in part on the signals relating to the measured plurality of temperatures, and the controller is configured to create a temperature map based at least in part on the plurality of measured temperatures, to determine the control signals for the plurality of OLEDs based at least in part on the temperature map, and the controller is configured to move an image from a first portion of the display to a second portion of the display based at least in part on the temperature map, wherein a first average temperature of the first portion of the display is greater than a second average temperature of the second portion of the display, and the first average temperature of the first portion is greater than the second average temperature due primarily to heat generated by the data processing circuitry.

11. The electronic device of claim 10, wherein the display is disposed over the central processing unit, the graphical processing unit, or the radio frequency transmitter, or any combination thereof, and the controller is configured to adjust the data processing circuitry to reduce heat generated by the data processing circuitry disposed beneath the display.

12. The electronic device of claim 10, wherein the plurality of OLEDs and the plurality of thermal sensors are disposed on a common layer of the display screen.

13. The electronic device of claim 10, wherein each OLED of the plurality of OLEDs is disposed across the display with a respective thermal sensor of the plurality of thermal sensors in a substantially 1:1 ratio, and the controller is configured to determine the control signals for each OLED based at least in part on the signals relating to the respective measured temperature of the plurality of measured temperatures from the respective thermal sensor.

14. The electronic device of claim 10, wherein the display screen comprises a plurality of zones, wherein each zone of the plurality of zones comprises at least two OLEDs of the plurality of OLEDs and at least one thermal sensor of the plurality of thermal sensors, and the controller is configured to determine the control signals for the at least two OLEDs of each zone based at least in part on the signals relating to the measured temperature from the at least one thermal sensor of that zone.

15. The display of claim 10, wherein the controller is configured to adjust the data processing circuitry based at least in part on the signals relating to the measured plurality of temperatures.

16. The display of claim 10, wherein the controller is configured to store the plurality of measured temperatures in a memory and create the temperature map based at least in part on the stored plurality of temperatures.

17. The electronic device of claim 16, wherein the controller is configured to determine the control signals for the plurality of OLEDs based at least in part on a running average of measured temperatures stored in the memory.

18. The display of claim 10, wherein the controller is configured to determine a degree of aging for the OLEDs based at least on the temperature map and determine the control signals for the plurality of OLEDs based at least in part on the degree of aging for the OLEDs.

19. The display of claim 15, wherein adjustments to the data processing circuitry comprise changing an operating speed of the central processing unit, changing an operating speed of the graphical processing unit, or changing a signal power of the radio frequency transmitter, or any combination thereof.

20. The display of claim 10, wherein the controller is configured to adjust the control signals for the plurality of OLEDs to adjust a brightness or a color of the plurality of OLEDs in a portion of the display based at least in part on a difference between the measured temperature of the portion of the display and the measured temperature of a remainder of the display.

21. A method of operating an electronic device, comprising:
driving a plurality of organic light emitting diodes (OLEDs) disposed across a display to emit light with control signals;
measuring temperature across the display by a plurality of thermal sensors disposed across the display;
determining effects of the measured temperature across the display on the light emitted by the plurality of OLEDs;
identifying a duration of operation of each OLED of the plurality of OLEDs above a threshold temperature;
moving a location of an image on the display from a first location to a second location based at least in part on the measured temperature across the display, wherein a first average temperature of the first location is greater than a second average temperature of the second location due substantially to heat from electronic components of the electronic device; and
adjusting the control signals based at least in part on the determined effects of the measured temperature and the identified durations of operation of the plurality of OLEDs above the threshold temperature, wherein the control signals are adjusted to affect the light emitted by the plurality of OLEDs.

22. The method of claim 21, comprising adjusting the drive signals for at least one component of a plurality of components of the electronic device beneath the display based at least in part on the measured temperature, wherein the plurality of components comprises a central processing unit, a graphical processing unit, or a radio frequency transmitter, or any combination thereof, and adjusting the drive signals for the at least one component of the plurality of components is configured to reduce heat generated by the at least one component.

23. The method of claim 21, comprising adjusting the control signals to affect the light emitted by the plurality of OLEDs to produce a uniform display appearance.

24. The method of claim 21, comprising adjusting the control signals to affect the light emitted by at least some OLEDs of the plurality of OLEDs in a portion of the display based at least in part on a difference between the measured temperature of the portion and the measured temperature of a remainder of the display.

25. The method of claim 24, wherein adjusting the control signals of at least some OLEDs of the plurality of OLEDs compensates a color, or a brightness, or a combination thereof of the light emitted by the at least some OLEDs.

26. The method of claim 21, comprising moving a location of an image on the display based at least in part on the measured temperature across the display to reduce a total of the adjustments to the control signals for the plurality of OLEDs.

\* \* \* \* \*